United States Patent
Wang

(10) Patent No.: US 10,496,121 B2
(45) Date of Patent: Dec. 3, 2019

(54) CURRENT MIRROR CIRCUIT AND DRIVING METHOD OF THE CURRENT MIRROR CIRCUIT

(71) Applicant: BOE Technology Group Co., Ltd., Beijing (CN)

(72) Inventor: Tangxiang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/747,379

(22) PCT Filed: Aug. 1, 2017

(86) PCT No.: PCT/CN2017/095509
§ 371 (c)(1),
(2) Date: Jan. 24, 2018

(87) PCT Pub. No.: WO2018/133374
PCT Pub. Date: Jul. 26, 2018

(65) Prior Publication Data
US 2018/0364751 A1  Dec. 20, 2018

(30) Foreign Application Priority Data

Jan. 17, 2017 (CN) .......................... 2017 1 0036312

(51) Int. Cl.
*G05F 3/26* (2006.01)
*H03F 3/345* (2006.01)
*H03K 17/687* (2006.01)

(52) U.S. Cl.
CPC ............... *G05F 3/262* (2013.01); *G05F 3/26* (2013.01); *H03F 3/345* (2013.01); *H03K 17/687* (2013.01)

(58) Field of Classification Search
CPC .... H02M 3/156; H02M 3/158; H02M 3/1588; H02M 3/155; H02M 3/1582;
(Continued)

(56) References Cited

U.S. PATENT DOCUMENTS

| 4,471,292 A | 9/1984 | Schenck et al. |
| 5,436,552 A * | 7/1995 | Kajimoto .................. G05F 3/26 323/313 |

(Continued)

FOREIGN PATENT DOCUMENTS

| CN | 101464700 A | 6/2009 |
| CN | 101071312 B | 4/2010 |
| CN | 202362694 U | 8/2012 |

OTHER PUBLICATIONS

Oct. 26, 2017—International Search Report and Written Opinion Appn PCT/CN2017/095509 with Eng Tran.

*Primary Examiner* — Nguyen Tran
*Assistant Examiner* — Bryan R Perez
(74) *Attorney, Agent, or Firm* — Banner & Witcoff, Ltd.

(57) ABSTRACT

A current mirror circuit includes: a first transistor and a second transistor connected in series, a third transistor and a fourth transistor connected in series; and further includes: a reference voltage source, a fifth transistor, and a control module connected between the reference voltage source and the fifth transistor. A current mirror is formed by the third transistor and the fourth transistor together with the first transistor and the second transistor, to produce a mirror current at a drain of the third transistor according to a current source coupled to a drain of the first transistor; the control module is configured to control the fifth transistor to operate in the linear region.

16 Claims, 3 Drawing Sheets

(58) Field of Classification Search
CPC ..... H02M 3/157; H02M 3/1563; G05F 3/222;
G05F 3/242; G05F 3/225; G05F 3/245;
G05F 3/185; G05F 3/227; G05F 3/247;
G05F 3/265; G05F 3/24; G05F 3/262;
G05F 3/345; G05F 1/56; G05F 1/46;
G05F 1/575; G05F 1/465; G05F 1/468;
G05F 1/462; G05F 1/562; G05F 1/565;
G05F 1/567; G05F 1/569; G05F 1/571;
G05F 1/573; G05F 1/5735
USPC ........ 323/288, 271, 282, 284–285, 311–313,
323/315
See application file for complete search history.

(56) References Cited

U.S. PATENT DOCUMENTS

| | | | |
|---|---|---|---|
| 7,259,614 B1 * | 8/2007 | Baker | G05F 1/46 323/311 |
| 2004/0124904 A1 | 7/2004 | Wu | |
| 2009/0160557 A1 | 6/2009 | Luzzi et al. | |
| 2013/0088276 A1 * | 4/2013 | Seth | H03F 1/301 327/307 |

* cited by examiner

CURRENT MIRROR CIRCUIT AND DRIVING METHOD OF THE CURRENT MIRROR CIRCUIT

The application is a U.S. National Phase Entry of International Application No. PCT/CN2017/095509 filed on Aug. 1, 2017, designating the United States of America and claiming priority to Chinese Patent Application No. 201710036312.1 filed on Jan. 17, 2017. The present application claims priority to and the benefit of the above-identified applications and the above-identified applications are incorporated by reference herein in their entirety.

TECHNICAL FIELD

Embodiments of the present disclosure relate to a current mirror circuit and a driving method of the current mirror circuit.

BACKGROUND

A current mirror circuit is an elementary circuit in an analog integrated circuit. It may be used for mirroring of currents, or may form a bias circuit to provide bias for other circuit. A cascode current mirror is often adopted due to its large output impedance and high mirroring precision, but a current mirror with a common cascode structure limits an output swing of the current mirror.

In order to realize a wide wing output of the current mirror, the structure of the cascode current mirror can be improved, but the improved structure of the cascode current mirror is likely to increase power consumption, or cannot implement the function of the current mirror.

SUMMARY

According to at least one of embodiments of the present disclosure, there is provided a current mirror circuit, comprising a first transistor and a second transistor connected in series, a third transistor and a fourth transistor connected in series, wherein sources of the second transistor and the fourth transistor are connected to a ground, and a current mirror is formed by the third transistor and the fourth transistor together with the first transistor and the second transistor, to produce a mirror current at a drain of the third transistor according to a current source coupled to a drain of the first transistor; further comprising: a reference voltage source, a fifth transistor, and a control module connected between the reference voltage source and the fifth transistor; wherein a source of the fifth transistor is connected to the drain of the first transistor, a gate of the second transistor and a gate of the fourth transistor, respectively, a drain of the fifth transistor is connected to a gate of the first transistor, a gate of the third transistor and an output terminal of the control module, respectively, and a gate of the fifth transistor and an input terminal of the control module are coupled to the reference voltage source through the current source, respectively; the control module is configured to control the fifth transistor to operate in a linear region.

For example, in the current mirror circuit provided in the embodiment of the present disclosure, the control module comprises a sixth transistor; wherein a source of the sixth transistor is the output terminal of the control module, a drain of the sixth transistor is the input terminal of the control module, and a gate of the sixth transistor is coupled to the reference voltage source through the current source.

For example, in the current mirror circuit provided in the embodiment of the present disclosure, a ratio between a width to length ratio of the fifth transistor and a width to length ratio of the sixth transistor is greater than or equal to 1/5 and smaller than or equal to 1/3.

For example, in the current mirror circuit provided in the embodiment of the present disclosure, the transistors are all N type transistors or all P type transistors.

For example, in the current mirror circuit provided in the embodiment of the present disclosure, threshold voltages of all the transistors are the same.

For example, in the current mirror circuit provided in the embodiment of the present disclosure, a minimum voltage $V_{DD}$ of the reference voltage source satisfies the following formula:

$$\begin{cases} \frac{1}{2}u_0 k_1 (V_{EC} - V_{th})^2 = u_0 k_2 \left[ (V_{EC} - V_{th}) \cdot Vov - \frac{1}{2} Vov^2 \right] \\ V_{EC} = V_{DD} - Vov - V_{th} \end{cases} ;$$

where, $u_0$ is a channel carrier mobility, $k_1$ is a width to length ratio of the fifth transistor and the sixth transistor connected in series, $k_2$ is a width to length ratio of the fifth transistor, Vov is a source voltage of the first transistor, and $V_{th}$ is a threshold voltage of the transistors.

For example, in the current mirror circuit provided in the embodiment of the present disclosure, all the transistors are thin film transistors or metal oxide semiconductor field effect transistors.

For example, in the current mirror circuit provided in the embodiment of the present disclosure, the first transistor, the second transistor, the third transistor and the fourth transistor have the same width to length ratio.

According to at least one of embodiments of the present disclosure, there is further provided a driving method of a current mirror circuit, the current mirror circuit comprising a first transistor and a second transistor connected in series, a third transistor and a fourth transistor connected in series, wherein sources of the second transistor and the fourth transistor are connected to a ground; wherein the current mirror circuit further comprises: a reference voltage source, a fifth transistor, and a control module connected between the reference voltage source and the fifth transistor; the method comprising: forming a current mirror by the third transistor and the fourth transistor together with the first transistor and the second transistor; producing a mirror current at a drain of the third transistor according to a current source coupled to a drain of the first transistor; connecting a source of the fifth transistor to the drain of the first transistor, a gate of the second transistor and a gate of the fourth transistor, respectively; connecting a drain of the fifth transistor to a gate of the first transistor, a gate of the third transistor and an output terminal of the control module, respectively; and coupling a gate of the fifth transistor and an input terminal of the control module to the reference voltage source through the current source, respectively; controlling the fifth transistor to operate in a linear region through the control module.

For example, the control module further comprises a sixth transistor, a source of the sixth transistor being the output terminal of the control module, a drain of the sixth transistor being the input terminal of the control module, and a gate of the sixth transistor being coupled to the reference voltage source through the current source.

For example, a ratio between a width to length ratio of the fifth transistor and a width to length ratio of the sixth transistor is greater than or equal to 1/5 and smaller than or equal to 1/3.

For example, the transistors are all N type transistors or all P type transistors.

For example, threshold voltages of all the transistors are the same.

For example, a minimum voltage $V_{DD}$ of the reference voltage source satisfies the following formula:

$$\begin{cases} \frac{1}{2}u_0 k_1 (V_{EC} - V_{th})^2 = u_0 k_2 \left[ (V_{EC} - V_{th}) \cdot Vov - \frac{1}{2} Vov^2 \right] \\ V_{EC} = V_{DD} - Vov - V_{th} \end{cases} ;$$

where, $u_0$ is a channel carrier mobility, $k_1$ is a width to length ratio of the fifth transistor and the sixth transistor connected in series, $k_2$ is a width to length ratio of the fifth transistor, Vov is a source voltage of the first transistor, and $V_{th}$ is a threshold voltage of the transistors.

For example, all the transistors are thin film transistors or metal oxide semiconductor field effect transistors.

For example, the first transistor, the second transistor, the third transistor and the fourth transistor have the same width to length ratio.

The current mirror circuit and the driving method of the same provided in the embodiments of the present disclosure are capable of realizing the wide wing output of the current mirror as well as improving reliability of the current mirror.

DETAILED DESCRIPTION

Specific implementations of a current mirror circuit provided in embodiments of the present disclosure will be described in detail by combining with accompanying figures.

Figure 1:
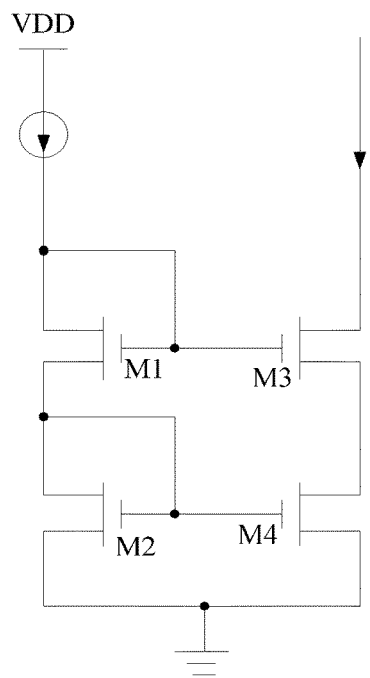
FIG. 1 is a first schematic diagrams of structure of a current mirror circuit.

FIG. 1 is a schematic diagram of structure of a current mirror having a cascode structure, and is formed by a first transistor M1 and a second transistor M2 connected in series together with a third transistor M3 and a fourth transistor M4 connected in series. Its mirror-imaging principle is to produce a mirror current at a drain of the third transistor M3 according to a current source coupled to a drain of the first transistor M1. The current mirror has a simple structure, but a drain voltage of its fourth transistor M4 is not maintained at a minimum voltage Vov required, but maintains at Vov+ $V_{th}$. Therefore, the minimum output voltage is $2V_{ov}+V_{th}$, thereby limiting an output swing of the current mirror.

Figure 2:
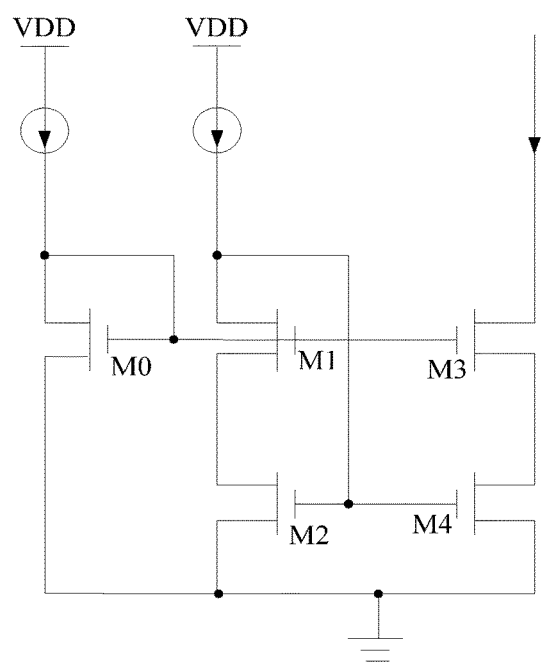
FIG. 2 is a second schematic diagram of structure of a current mirror circuit.

In order to realize wide swing output of the current mirror, there are two modes. One mode is a cascode current mirror structure as shown in FIG. 2. By adding one transistor M0 on the basis of the current mirror structure as shown in FIG. 1, the transistor M0 is used to bias a gate of the first transistor M1 and a gate of the third transistor M3, and a drain of the first transistor M1 is used to bias the gates of the second transistor M2 and the fourth transistor M4. In this way, it can realize that the output minimum voltage is only $2^{Vov}$, i.e., realizing the wide swing output. However, the defect existing in FIG. 2 means to add one more path of current, thereby increasing power consumption.

Figure 3:
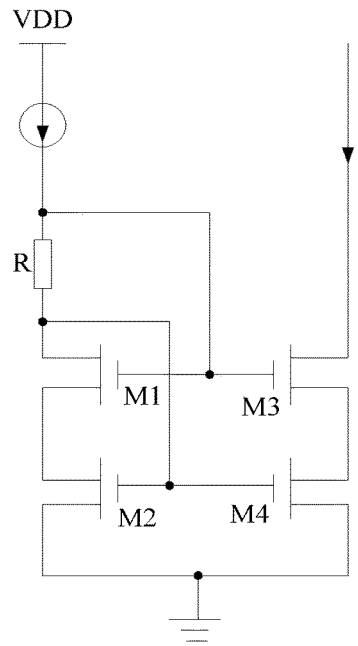
FIG. 3 is a third schematic diagram of structure of a current mirror circuit.

The other mode is a cascode current mirror structure as shown in FIG. 3, which biases the gates of the third transistor M3 and the fourth transistor M4 respectively by adding one resistor R on the basis of the current mirror structure as shown in FIG. 1. In this way, it can realize that the output minimum voltage is only $2^{Vov}$, i.e., realizing the wide swing output, and the current mirror structure can realize the wide swing output without adding one path of current. However, since the resistor R always occupy a relatively large area of layout and a resistance value of the resistor R fluctuates greatly as the process changes, it may cause the transistors to deviate from a saturation region but enter into the linear region if the design of allowance of the transistors is not enough, thereby failing to realize the function of the current mirror.

Figure 4:
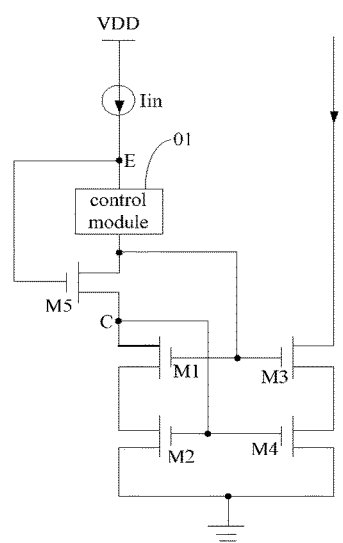
FIG. 4 is a first schematic diagram of structure of a current mirror circuit provided in an embodiment of the present disclosure.

As shown in FIG. 4, a current mirror circuit provided in an embodiment of the present disclosure comprises a first transistor M1 and a second transistor M2 connected in series, a third transistor M3 and a fourth transistor M4 connected in series. Sources of both the second transistor M2 and the fourth transistor M4 are connected to a ground; and a current mirror is formed by the third transistor M3 and the fourth transistor M4 together with the first transistor M1 and the second transistor M2 to produce a mirror current at a drain of the third transistor M3 according to a current source Iin coupled to the drain of the first transistor M1. The current mirror circuit can further comprise: a reference voltage source VDD, a fifth transistor M5, and a control module 01 connected between the reference voltage source VDD and the fifth transistor M5. Herein, a source of the fifth transistor M5 can be connected to the drain of the first transistor M1, a gate of the second transistor M2 and a gate of the fourth transistor M4, respectively, a drain of the fifth transistor M5 is connected to a gate of the first transistor M1, a gate of the third transistor M3 and an output terminal of the control module 01, and a gate of the fifth transistor M5 and an input terminal of the control module 01 are coupled to the reference voltage source VDD through the current source Iin. In addition, the control module 01 can be configured to control the fifth transistor M5 to operate in the linear region. The control module 01 can be for example, a controller, a microprocessor, etc.

The current mirror circuit provided in the embodiment of the present disclosure comprises the first transistor and the second transistor connected in series, and the third transistor and the fourth transistor connected in series; and further comprises: a reference voltage source, a fifth transistor, and a control module connected between the reference voltage source and the fifth transistor. A current mirror is formed by the third transistor and the fourth transistor together with the first transistor and the second transistor, to produce a mirror current at the drain of the third transistor according to a current source coupled to the drain of the first transistor; the control module is configured to control the fifth transistor to operate in the linear region, so as to utilize the fifth transistor operating in the linear region to function as a resistor for biasing the gate of the first transistor and the gate of the third transistor as well as the gate of the second transistor and the gate of the fourth transistor. In this way, the wide wing output of the current mirror can be realized, and also the reliability of the current mirror can be enhanced, without adding additional power consumption.

Figure 5:
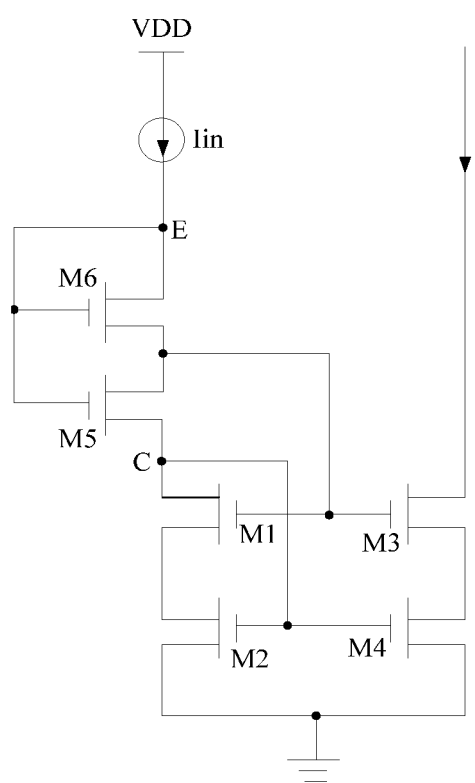
FIG. 5 is a second schematic diagram of structure of a current mirror circuit provided in an embodiment of the present disclosure.

According to one example of the present disclosure, in the current mirror circuit provided in the embodiment of the present disclosure, as shown in FIG. 5, the control module 01 can further comprise a sixth transistor M6. For example, a source of the sixth transistor M6 is the output terminal of the control module 01, a drain of the sixth transistor M6 is the input terminal of the control module 01, and a gate of the sixth transistor M6 is coupled to the reference voltage source VDD through the current source Iin.

It needs to specify that in the current mirror circuit provided in the embodiment of the present disclosure, since the gate and drain of the sixth transistor are connected, the sixth transistor operates in the saturation region. The gate of the fifth transistor is connected to the gate of the sixth transistor, and the drain of the fifth transistor is connected to the source of the sixth transistor, so that the sixth transistor can control the fifth transistor to operate in the linear region.

According to one example of the present disclosure, when a ratio between the width to length ratio of the fifth transistor and the width to length ratio of the sixth transistor is relatively small, a minimum voltage of the reference voltage source would be pulled up. When the ratio between the width to length ratio of the fifth transistor and the width to length ratio of the sixth transistor is relatively large, it cannot ensure that the fourth transistor operates in the saturation region. Therefore, preferably, in the current mirror circuit provided in the embodiment of the present disclosure, the ratio between the width to length ratio of the fifth transistor and the width to length ratio of the sixth transistor can be set to greater than or equal to 1/5 and smaller than or equal to 1/3, to which no further limitation is given.

According to one example of the present disclosure, in the current mirror circuit provided in the embodiment of the present disclosure, the transistors are all N type transistors or all P type transistors, to which no limitation is given.

According to one example of the present disclosure, in the current mirror circuit provided in the embodiment of the present disclosure, threshold voltages of all the transistors are the same, to which no limitation is given.

According to one example of the present disclosure, in order to make the current mirror circuit provided in the present disclosure operate normally, in the current mirror circuit provided in the embodiment of the present disclosure, as shown in FIG. 5, the minimum voltage $V_{DD}$ of the reference voltage source VDD satisfies the following formula $$\begin{cases} \frac{1}{2}u_0k_1(V_{EC} - V_{th})^2 = u_0k_2\left[(V_{EC} - V_{th}) \cdot Vov - \frac{1}{2}Vov^2\right] \\ V_{EC} = V_{DD} - Vov - V_{th} \end{cases};$$

where, $u_0$ is a channel carrier mobility, $k_1$ is a width to length ratio of the fifth transistor and the sixth transistor connected in series, $k_2$ is a width to length ratio of the fifth transistor, Vov is a source voltage of the first transistor, and $V_{th}$ is a threshold voltage of the transistors, E is the drain of the sixth transistor, and C is the source of the fifth transistor.

According to one example of the present disclosure, in the current mirror circuit provided in the embodiment of the present disclosure, as shown in FIGS. 4 and 5, all of the first transistor M1, the second transistor M2, the third transistor M3 and the fourth transistor M4 that implement the function of the current mirror operate in the saturation region.

Operating principles of the current mirror circuit provided in the present disclosure will be described in detail by taking the current mirror circuit as shown in FIG. 5 as an example. As an example, all the transistors in FIG. 5 are N type transistors.

As shown in FIG. 5, when all of the first transistor M1, the second transistor M2, the third transistor M3 and the fourth transistor M4 that form the current mirror structure operate in the saturation region, assuming that both a source voltage of the first transistor M1 and a source voltage of the third transistor M3 are Vov, a source voltage of the fifth transistor is Vov+$V_{th}$, and a drain voltage of the fifth transistor is $2^{Vov}$+$V_{th}$, so that a voltage output by the third transistor M3 in the current mirror circuit is $2^{Vov}$, i.e., realizing the wide wing output. In order to ensure that all of the first transistor M1, the second transistor M2, the third transistor M3 and the fourth transistor M4 forming the current mirror structure operate in the saturation region, the width to length ratio of the fifth transistor M5 operating in the linear region is required to be set reasonably, so that the source-drain voltage of the fifth transistor M5 is Vov. Assuming that the minimum voltage VDD of the reference voltage source VDD is $V_{DD}$, if the source-drain voltage of the fifth transistor M5 is to be Vov, at this time, the minimum voltage $V_{DD}$ of the reference voltage source VDD needs to satisfy the formula $$\begin{cases} \frac{1}{2}u_0k_1(V_{EC} - V_{th})^2 = u_0k_2\left[(V_{EC} - V_{th}) \cdot Vov - \frac{1}{2}Vov^2\right] \\ V_{EC} = V_{DD} - Vov - V_{th} \end{cases},$$

thus it can be derived that $V_{DD}$ needs to satisfy the formula of $\frac{1}{2}u_0k_1(V_{DD}-Vov-2V_{th})^2 = u_0k_2[(V_{DD}-Vov-2V_{th}) \cdot Vov - \frac{1}{2}Vov^2]$, and therefore $V_{DD}$ is related to $k_1$, $k_2$, Vov and $V_{th}$. For example, when the width to length ratio $k_2$ of the fifth transistor M5 is set to be one-third of the width to length ratio of the sixth transistor M6, i.e., $k_1=\frac{3}{4}k_2$, the minimum voltage $V_{DD}$ of the reference voltage source VDD can be calculated through this formula, i.e., $V_{DD}=3^{Vov}+2V_{th}$. Therefore, in the current mirror circuit provided in the embodiment of the present disclosure, when the minimum voltage $V_{DD}$ of the reference voltage source VDD is $3^{Vov}+2 V_{th}$, the wide wing output of the current mirror can be realized, and the output voltage is $2^{Vov}$.

According to one example of the present disclosure, in the current mirror circuit provided in the embodiment of the present disclosure, all the transistors may be thin film transistors (TFT), or may be metal oxide semiconductor field effect transistors, to which no limitation is given. In the embodiment of the present disclosure, functions of sources and drains of these transistors can be exchangeable depending on the type of the transistors as well as different input signals, to which no specific distinction is made.

According to one example of the present disclosure, in order to unify the manufacturing process of the transistors, in the current mirror circuit provided in the embodiment of the present disclosure, the first transistor, the second transistor, the third transistor and the fourth transistor have the same width to length ratio.

The current mirror circuit provided in the embodiment of the present disclosure comprises the first transistor and the second transistor connected in series, and the third transistor and the fourth transistor connected in series. The current mirror circuit can further comprise: a reference voltage source, a fifth transistor, and a control module connected between the reference voltage source and the fifth transistor. a current mirror is formed by the third transistor and the fourth transistor together with the first transistor and the second transistor, to produce a mirror current at the drain of the third transistor according to a current source coupled to the drain of the first transistor. The control module is configured to control the fifth transistor to operate in the linear region, so as to utilize the fifth transistor operating in the linear region to function as a resistor for biasing the gate of the first transistor and the gate of the third transistor as well as the gate of the second transistor and the gate of the fourth transistor. In this way, the wide wing output of the current mirror can be realized, and the reliability of the current mirror can be enhanced, without adding additional power consumption.

According to at least one embodiment of the present disclosure, there is further provided a driving method of a current mirror circuit. The driving method corresponds to the current mirror circuit in the embodiment described above. For the purpose of simplicity of the specification, only brief description is given herein.

In the driving method of the current mirror circuit, the current mirror circuit comprises a first transistor and a second transistor connected in series, a third transistor and a fourth transistor connected in series, wherein sources of the second transistor and the fourth transistor are connected to a ground; wherein the current mirror circuit further comprises: a reference voltage source, a fifth transistor, and a control module connected between the reference voltage source and the fifth transistor; the method comprises: forming a current mirror by the third transistor and the fourth transistor together with the first transistor and the second transistor; producing a mirror current at a drain of the third transistor according to a current source coupled to a drain of the first transistor; connecting a source of the fifth transistor to the drain of the first transistor, a gate of the second transistor and a gate of the fourth transistor, respectively; connecting a drain of the fifth transistor to a gate of the first transistor, a gate of the third transistor and an output terminal of the control module, respectively; and coupling a gate of the fifth transistor and an input terminal of the control module to the reference voltage source through the current source, respectively; controlling the fifth transistor to operate in a linear region through the control module.

For example, the control module further comprises a sixth transistor; a source of the sixth transistor is taken as the output terminal of the control module, a drain of the sixth transistor is taken as the input terminal of the control module, and a gate of the sixth transistor is coupled to the reference voltage source through the current source.

For example, a ratio between a width to length ratio of the fifth transistor and a width to length ratio of the sixth transistor is greater than or equal to 1/5 and smaller than or equal to 1/3.

For example, the transistors are all N type transistors or all P type transistors.

For example, threshold voltages of all the transistors are the same.

For example, a minimum voltage $V_{DD}$ of the reference voltage source satisfies the following formula:

$$\begin{cases} \frac{1}{2}u_0 k_1 (V_{EC} - V_{th})^2 = u_0 k_2 \left[ (V_{EC} - V_{th}) \cdot Vov - \frac{1}{2} Vov^2 \right] \\ V_{EC} = V_{DD} - Vov - V_{th} \end{cases};$$

wherein, $u_0$ is a channel carrier mobility, $k_1$ is a width to length ratio of the fifth transistor and the sixth transistor connected in series, $k_2$ is a width to length ratio of the fifth transistor, Vov is a source voltage of the first transistor, and $V_{th}$ is a threshold voltage of the transistors.

For example, all the transistors are thin film transistors or metal oxide semiconductor field effect transistors.

For example, the first transistor, the second transistor, the third transistor and the fourth transistor have the same width to length ratio.

Obviously, those skilled in the art can make various changes and modifications to the present disclosure without departing from the spirit and scope of the present disclosure. In this way, if these changes and modifications of the present disclosure fall within the scope of the claims of the present disclosure as well as its equivalent technology, then the present disclosure also intends to include these changes and modifications.

The present application claims the priority of a Chinese patent application No. 201710036312.1 filed on Jan. 17, 2017. Herein, the content disclosed by the Chinese patent application is incorporated in full by reference as a part of the present disclosure.

What is claimed is:

1. A current mirror circuit, comprising a first transistor and a second transistor connected in series, a third transistor and a fourth transistor connected in series, wherein sources of the second transistor and the fourth transistor are connected to a ground, and a current mirror is formed by the third transistor and the fourth transistor together with the first transistor and the second transistor, to produce a mirror current at a drain of the third transistor according to a current source connected to a drain of the first transistor; the current mirror circuit further comprising: a reference voltage source, a fifth transistor, and a control module, wherein the control module is connected to the reference voltage source and the fifth transistor; wherein a source of the fifth transistor is connected to the drain of the first transistor, a gate of the second transistor, and a gate of the fourth transistor, a drain of the fifth transistor is connected to a gate of the first transistor, a gate of the third transistor, and an output terminal of the control module, and a gate of the fifth transistor and an input terminal of the control module are connected to the reference voltage source through the current source; and the control module is configured to control the fifth transistor to operate in a linear region, so as to utilize the fifth transistor operating in the linear region to function as a resistor for biasing the gate of the first transistor and the gate of the third transistor as well as for biasing the gate of the second transistor and the gate of the fourth transistor.

2. The current mirror circuit according to claim 1, wherein the control module comprises a sixth transistor, and wherein a source of the sixth transistor is the output terminal of the control module, a drain of the sixth transistor is the input terminal of the control module, and a gate of the sixth transistor is connected to the reference voltage source through the current source.

3. The current mirror circuit according to claim 2, wherein a ratio between a width to length ratio of the fifth transistor and a width to length ratio of the sixth transistor is greater than or equal to 1/5 and smaller than or equal to 1/3.

4. The current mirror circuit according to claim 1, wherein the transistors are all N type transistors or all P type transistors.

5. The current mirror circuit according to claim 2, wherein threshold voltages of all of the transistors are the same.

6. The current mirror circuit according to claim 5, wherein a minimum voltage $V_{DD}$ of the reference voltage source satisfies the following formula:

$$\begin{cases} \frac{1}{2}u_0k_1(V_{EC}-V_{th})^2 = u_0k_2\left[(V_{EC}-V_{th}) \cdot Vov - \frac{1}{2}Vov^2\right] \\ V_{EC} = V_{DD} - Vov - V_{th} \end{cases};$$

where,
$u_0$ is a channel carrier mobility, $k_1$ is a width to length ratio of the fifth transistor and the sixth transistor connected in series, $k_2$ is a width to length ratio of the fifth transistor, Vov is a source voltage of the first transistor, and $V_{th}$ is a threshold voltage of the transistors.

7. The current mirror circuit according to claim 1, wherein all of the transistors are thin film transistors or metal oxide semiconductor field effect transistors.

8. The current mirror circuit according to claim 1, wherein the first transistor, the second transistor, the third transistor, and the fourth transistor have a same width to length ratio.

9. A driving method of a current mirror circuit, the current mirror circuit comprising a first transistor and a second transistor connected in series, a third transistor and a fourth transistor connected in series, wherein sources of the second transistor and the fourth transistor are connected to a ground, wherein the current mirror circuit further comprises: a reference voltage source, a fifth transistor, and a control module connected to the reference voltage source and the fifth transistor, the method comprising:
  forming a current mirror by the third transistor and the fourth transistor together with the first transistor and the second transistor;
  producing a mirror current at a drain of the third transistor according to a current source connected to a drain of the first transistor;
  connecting a source of the fifth transistor to the drain of the first transistor, a gate of the second transistor, and a gate of the fourth transistor;
  connecting a drain of the fifth transistor to a gate of the first transistor, a gate of the third transistor, and an output terminal of the control module;
  connecting a gate of the fifth transistor and an input terminal of the control module to the reference voltage source through the current source; and
  controlling the fifth transistor to operate in a linear region through the control module, so as to utilize the fifth transistor operating in the linear region to function as a resistor for biasing the gate of the first transistor and the gate of the third transistor as well as for biasing the gate of the second transistor and the gate of the fourth transistor.

10. The method according to claim 9, wherein the control module further comprises a sixth transistor, and wherein a source of the sixth transistor is the output terminal of the control module, a drain of the sixth transistor is the input terminal of the control module, and a gate of the sixth transistor is connected to the reference voltage source through the current source.

11. The method according to claim 10, wherein a ratio between a width to length ratio of the fifth transistor and a width to length ratio of the sixth transistor is greater than or equal to 1/5 and smaller than or equal to 1/3.

12. The method according to claim 9, wherein the transistors are all N type transistors or all P type transistors.

13. The method according to claim 10, wherein threshold voltages of all of the transistors are the same.

14. The method according to claim 13, wherein a minimum voltage VDD of the reference voltage source satisfies the following formula:

$$\begin{cases} \frac{1}{2}u_0k_1(V_{EC}-V_{th})^2 = u_0k_2\left[(V_{EC}-V_{th}) \cdot Vov - \frac{1}{2}Vov^2\right] \\ V_{EC} = V_{DD} - Vov - V_{th} \end{cases};$$

where,
$u_0$ is a channel carrier mobility, $k_1$ is a width to length ratio of the fifth transistor and the sixth transistor connected in series, $k_2$ is a width to length ratio of the fifth transistor, Vov is a source voltage of the first transistor, and $V_{th}$ is a threshold voltage of the transistors.

15. The method according to claim 9, wherein all of the transistors are thin film transistors or metal oxide semiconductor field effect transistors.

16. The method according to claim 9, wherein the first transistor, the second transistor, the third transistor, and the fourth transistor have a same width to length ratio.

* * * * *